United States Patent [19]
LeGuin

[11] Patent Number: 5,778,552
[45] Date of Patent: Jul. 14, 1998

[54] TOUCH SENSOR

[75] Inventor: Hermann LeGuin, Amtzell, Germany

[73] Assignee: Renishaw plc, Gloucestershire, United Kingdom

[21] Appl. No.: 643,445

[22] Filed: May 8, 1996

[30]  Foreign Application Priority Data

May 8, 1995 [DE] Germany ......................... 195 16 272.2

[51] Int. Cl.$^6$ ............................................. G01B 5/00
[52] U.S. Cl. .................................. 33/559; 33/503; 33/556
[58] Field of Search ............................. 33/503, 559, 556

[56]  References Cited

U.S. PATENT DOCUMENTS

| | | | |
|---|---|---|---|
| 4,815,214 | 3/1989 | Enderle et al. ............................ | 33/503 |
| 4,916,825 | 4/1990 | Breyer ...................................... | 33/559 |
| 5,005,297 | 4/1991 | Aehnelt et al. ........................... | 33/559 |
| 5,111,592 | 5/1992 | Aehnelt et al. ........................... | 33/559 |
| 5,209,131 | 5/1993 | Baxter ...................................... | 33/559 |
| 5,323,540 | 6/1994 | McMurtry et al. ....................... | 33/559 |
| 5,430,072 | 7/1995 | Lloyd et al. .............................. | 33/559 |

*Primary Examiner*—Thomas B. Will
*Assistant Examiner*—Andrew Hirshfeld
*Attorney, Agent, or Firm*—Bachman & LaPointe, P.C.

[57]  ABSTRACT

In a touch sensor for detecting the deflection of a feeler pin or the like, which is mounted for movement against a pressure element in a housing (1, 27), the pressure element is to consist of two magnets (23, 24) of opposite polarity, one of them being associated with the feeler pin or the like.

4 Claims, 1 Drawing Sheet

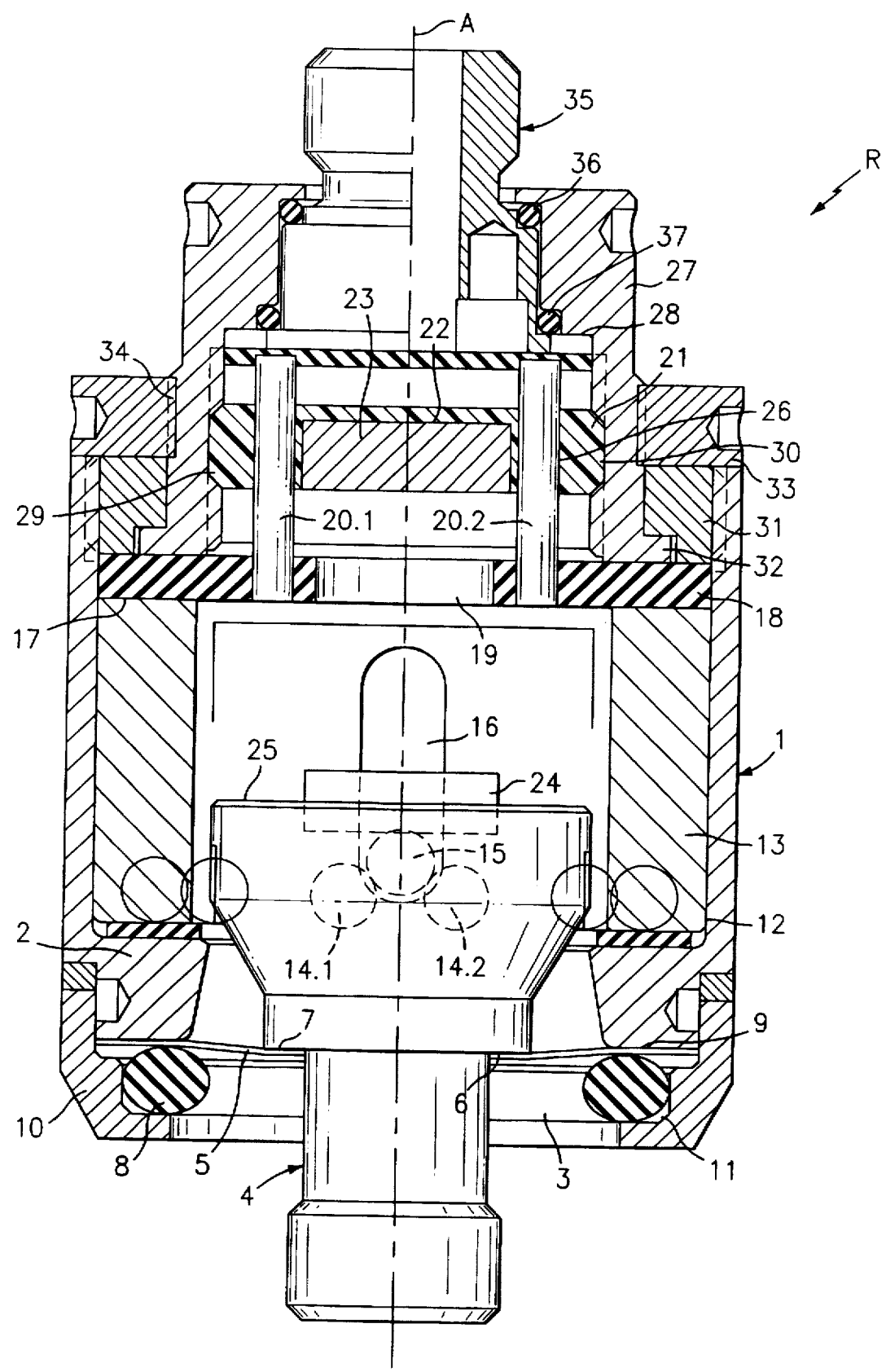

5,778,552

TOUCH SENSOR

BACKGROUND OF THE INVENTION

The present invention relates to a touch sensor for detecting the deflection of a feeler pin or the like which is mounted movable against a pressure element in a housing.

Touch sensors are used, for instance, in measuring devices which are provided with a feeler pin which is movable relative to a workpiece to be measured. Upon a measurement, the measurement sensor is moved towards the workpiece until the feeler pin contacts the workpiece and is deflected out of the position which it itself has determined. A signal is then produced in the touch sensor and is sent to a suitable measuring device. If the workpiece is approached by the feeler pin from several sides, the shape of the workpiece can be noted therefrom.

Such touch sensors or probe heads are known. As example, reference is had here to Federal Republic of Germany Patent 23 47 633. In that case, three arms extend radially from the feeler pin, the arms lying against corresponding sides of a V-shaped notch formed by two bearing balls. Detection of the switch signal is effected by an electric circuit which is closed when the feeler pin is in its neutral position. The circuit extends, in series connection, through the bearing balls, in which connection in the neutral position the arms extending from the feeler pin act as bridge contacts. As soon as an arm is lifted, this circuit is interrupted and a signal is thus produced. This takes place against the force of a compression spring which rests between the feeler pin and an opposing element. The insertion of this compression spring and the assembling of the entire touch sensor is extremely difficult, as is the handling thereof.

The object of the present invention is to provide a mounting for the feeler pin or the like which, on the one hand, is free of transverse force and, on the other hand, can be adjusted.

SUMMARY OF THE INVENTION

This object is achieved, on the one hand, in a manner that the pressure element consists of two magnets of opposite polarity, one being associated with the feeler pin or the like.

When in the present case, mention is made of a feeler pin, not only is there concerned an individual pin but there may also be meant feeler crosses, etc. The resting of the feeler pin against a magnet of opposite polarity has the essential advantage that the feeler pin is supported entirely free of transverse forces. This has a very positive effect upon every type of deflection of the feeler pin. In particular, mention should also be made of the simplicity of the assembling, since the magnets can be very easily adjusted with respect to each other.

A second part of the invention relates to the adjustment of the pressure element; this second part can be used both in connection with an ordinary compression spring and in connection with the magnets of opposite polarity just described. In this case, the pressure element is to be located between the feeler pin and a disk which is mounted for axial displacement within the housing. In this connection, an external thread of the disk engages into an internal thread of a housing part. To the disk there is connected in its turn a rotatable housing sleeve which serves to receive the feeler pin and is mounted for turning with respect to the housing part. The mounting with respect to the housing part is preferably effected by means of a lock nut which, if desired, effects a fastening of the housing sleeve with respect to the housing part. However, if it is loosened, the housing part can be turned without an axial offset of housing part to housing sleeve taking place. However, since the disk is connected with the housing sleeve, this disk is carried along and displaced axially upon the turning of the housing sleeve. Since, in its turn, the pressure element is located between this disk and the feeler pin, a spring can for instance be prestressed to a greater or lesser extent or a distance between two magnets can be changed and the pressing force on the feeler pin regulated in this way.

The connection of the housing sleeve to the disk is preferably effected by at least one pin which passes through a corresponding hole in the disk so that the disk can slide along this pin.

Such an arrangement of the feeler pin in a turnable housing sleeve has another essential advantage. As a rule, the feeler pin is not located directly within the housing sleeve but is connected to a coupling piece which is mounted in the housing sleeve and rests there against the pressure element. If a feeler pin or touch cross is now screwed into this coupling piece, it must be adjusted for a specific starting position. In the known touch sensors this is effected by the interposing of intermediate pieces between coupling piece and touch sensor, by which the alignment of the turn crosses can be determined.

In accordance with the present invention, however, the adjustment of the touch cross can be effected extremely simply in the manner namely that, for instance, the adjustment of the pressure force is effected by turning the housing sleeve. The housing sleeve can then still be so turned within a small angular region that the test cross is adjusted without any noticeable change taking place in the pressure force. In this way, the handling of the touch sensor of the invention is extremely simplified. It should be emphasized that the touch sensor need not be removed from its corresponding support either for the adjustment of the pressure force or for the adjustment of the feeler cross. A simple loosening of the lock nut is sufficient in order to effect all of these adjustments.

BRIEF DESCRIPTION OF THE DRAWINGS

Other adjustments, features, and details of the invention will become evident from the following description of a preferred embodiment read with reference to the drawing wherein the sole figure of the drawing is a cross section through a touch sensor R in accordance with the invention.

DETAILED DESCRIPTION OF THE PREFERRED EMBODIMENT(S)

The touch sensor R has an approximately cylindrical housing sleeve 1 which is limited at the bottom by an inward flange 2. This inward flange 2 surrounds an opening 3 in which a coupling piece 4 is movably mounted. A feeler pin, feeler cross or the like, not shown in detail, is connected to said coupling piece 4. As a rule, this feeler pin, feeler cross or the like is screwed into an end hole in the coupling piece 4.

The coupling piece 4 is held in the opening 3 by a flexible clamping ring 5, the clamping ring 5 having an approximately central cutout 6 through which a part of the coupling piece 4 is extended. In this connection, the edge of the cutout 6 rests against a shoulder 7 of the coupling piece 4.

The clamping ring 5 is pressed by an elastic ring 8 against an edge 9 of the inward flange 2. For the holding of the ring 8, there is therefore placed on the inward flange 2 a clamping profile 10 which, by means of an annular trough 11 within which the ring 8 lies, presses the latter against the clamping ring 5.

At the other end of the clamping ring 5, a board 12 such as is described in Utility Model 94 11 566.4 lies on the inward flange 2. On the board 12 there rests an inner sleeve 13 in which balls 14.1 are mounted. These balls 14.2 serve for the conducting of current or the interrupting of an electric circuit in cooperation with transverse pins 15 which are connected with the coupling piece 4. As long as the transverse pin 15 lies on two balls 14.1 and 14.2, a corresponding circuit is closed; if the transverse pin 15 is raised, the current is interrupted.

A vertical slot 16 arranged in the inner sleeve 13 serves to secure the transverse pin 15 against turning and to guide it. The balls 14.1 and 14.2 extend somewhat into the inside of the slot 16 so that they can be brought into contact with the transverse pin 15. Ordinarily, three such transverse-pin/ball mountings are sufficient.

A further board 18 is placed on the upper edge of the inner sleeve 13. This board 18 is of disk shape, with an approximately central opening 19. From the board 18 pins 20.1 and 20.2 for the conducting of current extend upward, passing in this Connection through a disk 21. In this disk 21 there is formed a trough 22 which is open towards the bottom and which serves to receive a magnet 23. This magnet 23 is of opposite polarity to the magnet 24 which is seated in an end surface 25 of the coupling piece 4. By the different polarity of the magnets 23 and 24 assurance is had that they repel each other, i.e. the coupling piece 4 is pressed with its transverse pin 15 against the balls 14.1 and 14.2.

The pins 20.1 and 20.2 pass with clearance through vertical holes 26 in the disk 21. The disk 21 can thus slide along the pins 20.1 and 20.2. This means that the disk 21 and, with it, the magnet 23 can be guided along a longitudinal axis A of the touch sensor R towards and away from the magnet 24. In this way, the intensity of the magnetic repulsion can be controlled. The disk 21 is guided in another housing part 27, said part having an inner stepped borehole 28. A part of this stepped borehole 28 is provided with an internal thread 29 into which there engages an external thread 30 which is developed on the circumference of the disk 21. If the housing part 27 remains stationary and the disk 21 is turned, then the disk 21 effects the above-described axial displacement.

The housing part 27 is pressed against the board 18 by an intermediate ring 31 which presses against an outer flange 32 of the housing part 27, provided that a lock nut 33 which is present on an externally threaded section 34 of the housing part 27 is tightened. If this lock nut 33 is tightened, the housing sleeve 1 and, together with it, the inner sleeve 13, the coupling piece 4, the board 18, and the pin 20.1 and 20.2 are fixed in position. On the other hand, if the lock nut 33 is loosened, then the housing sleeve, together with the parts just mentioned, can be turned with respect to the housing part 27. Upon the turning, the disk 21 is carried along via the pins 20.1 and 20.2 so that the distance apart of the two magnets 23 and 24 can be varied.

Within the stepped borehole 28 there is inserted another coupling piece 35 which rests, via corresponding insulating rings 36 and 37, against shoulders on the stepped borehole 28.

I claim:

1. A touch sensor comprising:

a housing having an axis, a movable member mounted in the housing a feeler pin connected to the movable member, a disc mounted for axial displacement within the housing, a pressure element located between the movable member and the disc for providing an axial biasing force on the movable member against which the movable member is displaceable when the feeler pin is deflected, means including an electrical circuit for providing a signal when the feeler pin is deflected, wherein an external screw thread is carried by the disc and engages with an internal thread on a first part of the housing, the housing having a second part which is rotatable about the axis relative to the first part, and which is connected to at least one pin which extends axially within the housing and passes through the disc, whereby rotation of said rotatable part of the housing relative to the first part causes rotation of the disc to produce said axial displacement thereof to vary the axial biasing force.

2. A touch sensor according to claim 1 wherein the pressure element comprises two magnets of opposite polarity, one of which is connected to the disc and the other one of which is connected to the movable member.

3. A touch sensor according to claim 1 wherein the first and second housing parts are releasably locked against relative rotation by a lock nut.

4. A touch sensor according to claim 1 wherein said at least one pin forms part of the electrical circuit of the probe.

* * * * *